United States Patent [19]
Nevill

[11] Patent Number: 6,154,042
[45] Date of Patent: Nov. 28, 2000

[54] UNIFORM TEMPERATURE ENVIRONMENTAL TESTING APPARATUS FOR SEMICONDUCTOR DEVICES

[75] Inventor: Leland R. Nevill, Boise, Id.

[73] Assignee: Micron Technology, Inc., Boise, Id.

[21] Appl. No.: 08/637,484

[22] Filed: Apr. 24, 1996

[51] Int. Cl.$^7$ ................................................. G01R 31/02
[52] U.S. Cl. ......................... 324/760; 324/755; 324/765
[58] Field of Search .................................... 324/760, 754, 324/755, 756, 757, 758, 763

[56] References Cited

U.S. PATENT DOCUMENTS

| | | | |
|---|---|---|---|
| 4,899,107 | 2/1990 | Corbett et al. ...................... | 324/73.1 X |
| 4,967,155 | 10/1990 | Magnuson ............................ | 324/760 X |
| 5,103,168 | 4/1992 | Fuoco .................................. | 324/760 X |
| 5,180,974 | 1/1993 | Mitchell et al. .................... | 324/760 X |
| 5,694,049 | 12/1997 | Singh et al. ............................ | 324/755 |

*Primary Examiner*—Safet Metjahic
*Assistant Examiner*—T. R. Sundaram
*Attorney, Agent, or Firm*—Dorsey & Whitney LLP

[57] ABSTRACT

A method and apparatus for maintaining a uniform temperature of semiconductor devices mounted on a burn-in board. A cover is positioned on the burn-in board to enclose all of the semiconductor devices mounted on the board. A plurality of such burn-in boards are then placed in a burn-in oven of conventional design for burn-in testing of the semiconductor devices. The cover prevents a non-uniform airflow along the semiconductor devices which would cause the semiconductor devices to have a non-uniform temperature distribution.

15 Claims, 3 Drawing Sheets

UNIFORM TEMPERATURE ENVIRONMENTAL TESTING APPARATUS FOR SEMICONDUCTOR DEVICES

TECHNICAL FIELD

This invention relates to testing of semiconductor devices, and more particularly to a method and apparatus for ensuring that a large number of semiconductor devices mounted on a common circuit board are at a uniform temperature during environmental testing of the semiconductor devices.

BACKGROUND OF THE INVENTION

The testing of semiconductor devices, such as dynamic random access memories, is a very important step in the manufacture of quality semiconductor devices. A number of tests are generally performed on semiconductor devices using automatic test equipment to identify semiconductor devices that are malfunctioning or likely to malfunction in the future. As is well known in the art, although semiconductor devices are very reliable, if they are to fail at all, they tend to fail during the early part of their service life. This early failure phenomenon, known as "infant mortality," provides an opportunity to ensure that semiconductor devices sold by a manufacturer will have a long, useful life.

Although semiconductor devices can be tested at room temperature to identify devices that are malfunctioning or likely to malfunction, such testing is preferably done at other than room temperature. Generally, such environmental testing is at an elevated temperature in "burn-in ovens" but may also be done at a reduced temperature in cooling chambers. The advantage of environmental testing is that the devices are tested in "real world" conditions. As a result, it is possible to identify semiconductor devices that will work properly at room temperature, but will malfunction or fail to meet specifications at the reduced or elevated temperatures that will be encountered during actual use. Further, operating semiconductor devices at an elevated temperature during "burn-in" testing tends to accelerate infant mortality thus allowing quicker identification of semiconductor devices that are likely to malfunction early in their lifetimes.

Post-production environmental testing is generally limited to testing at elevated temperatures, although certain semiconductors, such as those conforming to military specifications, are also tested at reduced temperatures. However, in the interest of brevity, the discussion of environmental testing will be limited to testing at elevated temperatures, it being understood that the discussion also applies to testing at reduced temperatures. Accordingly, environmental testing of semiconductor devices is generally accomplished by placing the semiconductor devices in large burn-in ovens which may hold on the order of 8,000 semiconductor devices. The semiconductor devices are generally temporarily placed on large printed circuit-boards by inserting the semiconductor devices into respective sockets. These printed circuit-boards, known as "burn-in boards" generally have an edge connector that is adapted to plug into a respective connector in a burn-in oven.

A typical burn-board 10 is illustrated in FIGS. 1 and 2. The burn-board 10 has a conventional printed circuit substrate 12 on which an edge connector 14 is formed. A plurality of semiconductor device sockets, indicated generally at 16, are mounted on the substrate 12. In the example shown in FIGS. 1 and 2, 256 semiconductor device sockets 16 are mounted on the substrate 12 in 16 rows and 16 columns. However, it will be understood that greater or fewer semiconductor device sockets 16 may be mounted on the substrate 12 and in a different row and column configuration. A semiconductor device, generally indicated at 18, is inserted in each of the sockets 16. However, the semiconductor devices 18 may be tested without inserting them in sockets 16 by permanently mounting the devices 18 on a substrate 12 to form a functioning circuit.

A typical burn-in oven used in production testing of semiconductor devices is illustrated in FIG. 3. The burn-in oven 20 has an enclosed chamber 22 open at the front of the oven 20 which is normally closed by doors (not shown) pivotally mounted on the oven 20. A plurality of vertically spaced racks 24 are mounted on each side of the chamber 22. The burn-in boards 10 containing the semiconductor devices 18 are positioned on respective racks 24 and inserted into the chamber 22 until the board connector 14 mates with a respective test connector 28 positioned at the rear of the chamber 22. The test connector 28 is coupled to conventional test equipment 30 that performs appropriate tests on the semiconductor devices 18 depending upon the nature of such devices and the degree of testing desired.

Specifications for environmentally testing semiconductor devices generally specify that the tests occur at a specific temperature or narrow range of temperatures. It is therefore desirable to maintain the temperatures in the chamber 22 as uniform as possible throughout the chamber 22. If the chamber 22 was simply heated, the upper portion of the chamber 22 would be hotter than the lower portion since hot air rises. For this reason, burn-in ovens 20 produce an airflow through the chamber 22. By directing air from the same source through both the upper and lower portions of the chamber 22, the upper and lower portions of the chamber 22 can be maintained at approximately the same temperature.

Although vertical temperature gradients can be minimized by air flowing through the chamber 22, doing so does not entirely solve the problem of uneven temperatures of the semiconductor devices 18. The problem is primarily an uneven temperature distribution among the semiconductor devices 18 on each burn-in board 10. In particular, if the airflow across the surface of the burn-in board 10 is not uniform, the temperature of semiconductor devices 18 on the substrate 12 will also not be uniform. Similarly, if the airflow across one of the burn-in boards 10 is different from the airflow across a different burn-board 10, the temperatures of the semiconductor devices 18 on the two boards will differ significantly from each other.

In an attempt to provide uniform temperatures of semiconductor devices 18 on burn-in boards 10, a great deal of effort has been devoted to making the airflow through the chambers 22 of burn-in ovens 20 as uniform as possible. Thus, for example, a large number of relatively small, uniformly distributed vents 34 have been formed on opposite sides of the chamber 22 in an attempt to provide a uniform airflow throughout the entire height, width and length of the chamber 22. However, these attempts have not been entirely successful because, for example, the presence of the racks 24 and the burn-in boards 10 themselves can prevent a uniform airflow even if small vents 34 are uniformly distributed. Furthermore, even if the disruptions caused by the racks 24 and the boards 10 could be eliminated, the airflow would still be somewhat non-uniform because of the effects of the top, bottom, front and back walls of the chamber 22. Thus, despite diligent efforts to improve the uniformity of flow through the chambers 22 of burn-in ovens 20, the temperature of semiconductor devices 18 undergoing burn-in testing may vary excessively. There is therefore a need for an environmental testing device that ensure a greater temperature uniformity of semiconductor devices being environmentally tested.

SUMMARY OF THE INVENTION

The inventive method and apparatus ensures that semiconductor devices have a uniform temperature during environmental testing in an enclosed environmental testing chamber. Such testing chamber include a temperature regulating device for controlling the temperature in the testing chamber, and an airflow device for causing air to flow through the testing chamber. In accordance with the invention, a plurality of semiconductor devices are mounted on a circuit boards, and a number of such circuit boards are placed in the environmental chamber. A cover is mounted on each circuit board to substantially enclose the semiconductor devices on the circuit board. The cover is preferably mounted directly on the circuit board, and it is preferably formed from a material that is substantially impervious to the flow of air therethrough. The cover prevents air flowing through the environmental chamber from contacting the semiconductor devices, thus preventing a non-uniform airflow over the semiconductor devices which would cause their temperatures to be non-uniform. The circuit boards have respective board connectors that plug into respective test connectors in the environmental chamber to connect the semiconductor devices to a test device. The semiconductor devices are then tested at a reduced or an elevated temperature. The semiconductor devices are preferably mounted in respective sockets so that they may be easily removed from the circuit board after testing. The cover may include a top panel sized and shaped to generally conform to the size and shape of the circuit board, and a side panel extending from each edge of the top panel at substantially a right angle to terminate in respective marginal edges. The marginal edges of the side panels may then rest on the circuit board with the top panel overlying substantially all of the semiconductor devices.

DETAILED DESCRIPTION OF THE INVENTION

As explained above, prior attempts to ensure that semiconductor devices in environmental test chambers have a uniform temperature have relied on the conventional wisdom that uniformity can be achieved only by ensuring a uniform airflow. Thus, based on this conventional wisdom, attempts to improve uniformity have focused on making the airflow ever more uniform. The inventive method and apparatus for environmentally testing semiconductor devices disregards this conventional wisdom and instead focuses on entirely eliminating the airflow across the semiconductor devices on circuit boards. As a result, temperature variations of semiconductor devices on circuit boards are entirely eliminated. Moreover, the inventive method and apparatus can be used without modifying conventional burn-in ovens in any manner.

Figure 1:
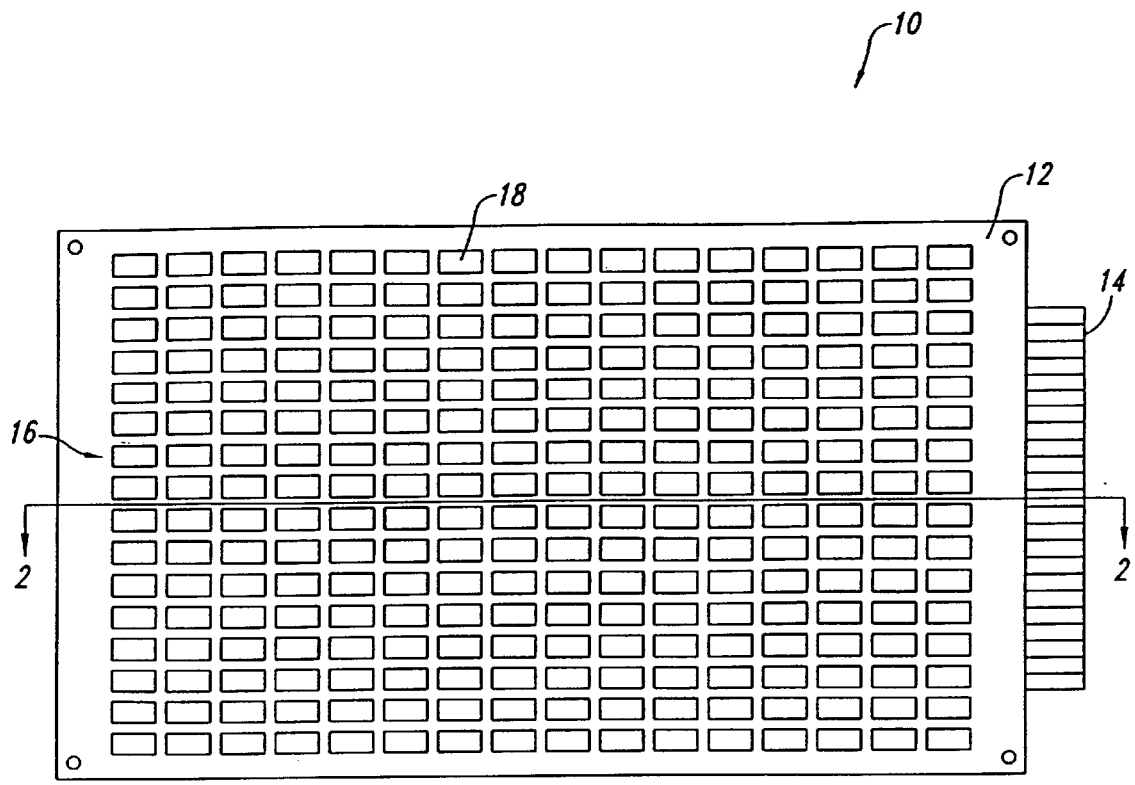
FIG. 1 is a top plan view of a conventional burn-in board of the type used in a conventional burn-in oven showing a large number of semiconductor devices temporarily mounted on the board for burn-in testing.
Figure 2:
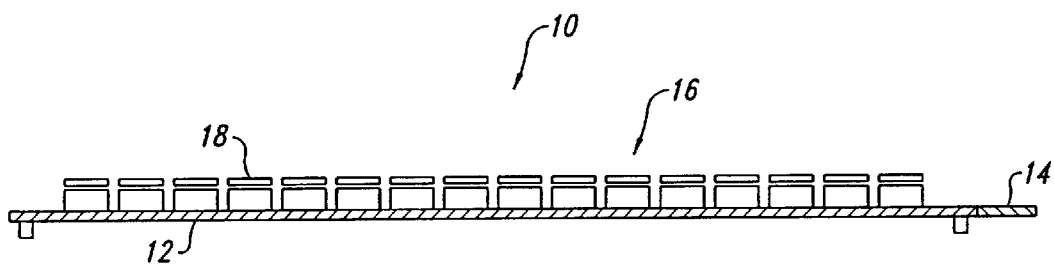
FIG. 2 is a cross-sectional view taken along the line 2—2 of FIG. 1.
Figure 3:
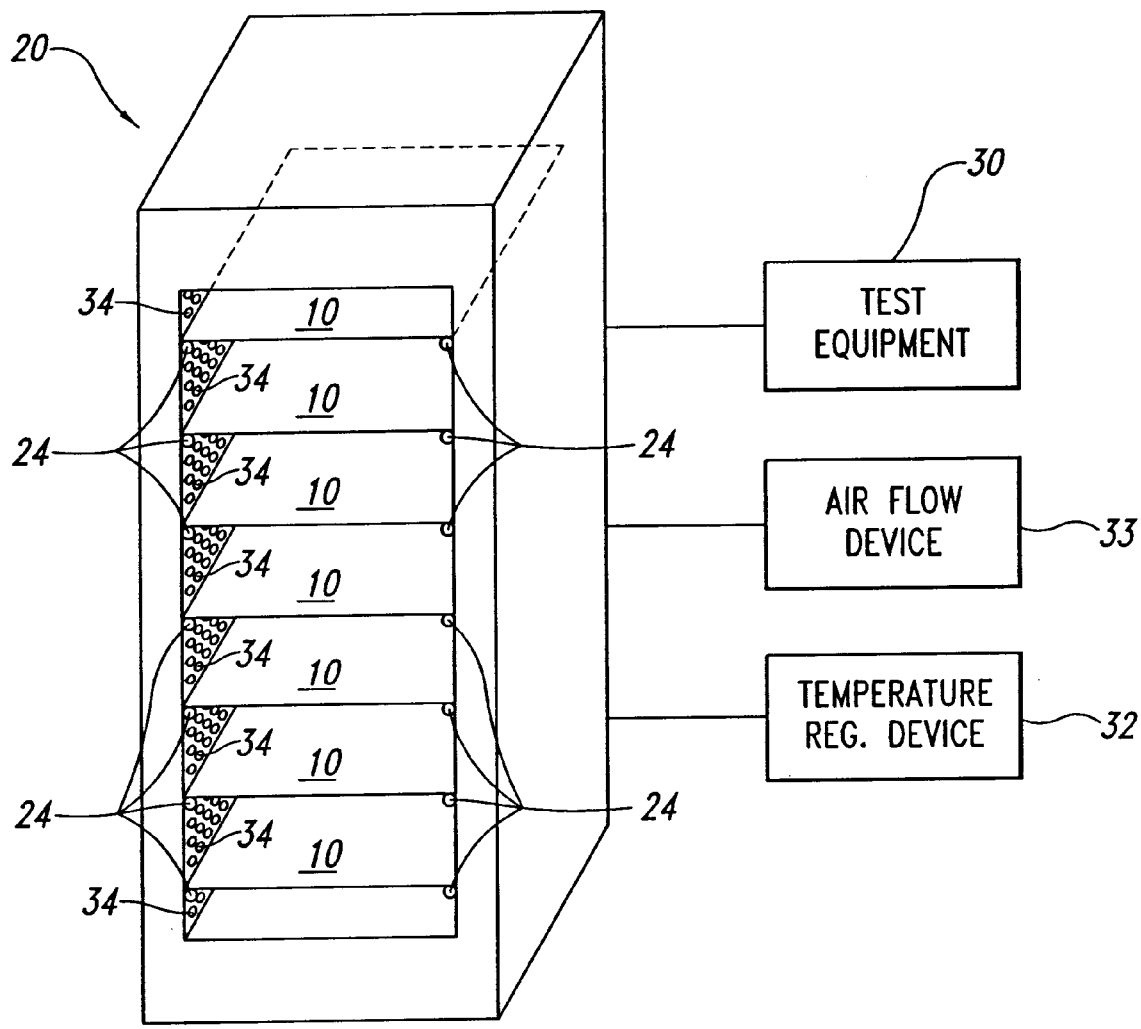
FIG. 3 is a front elevational view of a conventional burn-in oven used to perform burn-in test on semiconductor devices.
Figure 4:
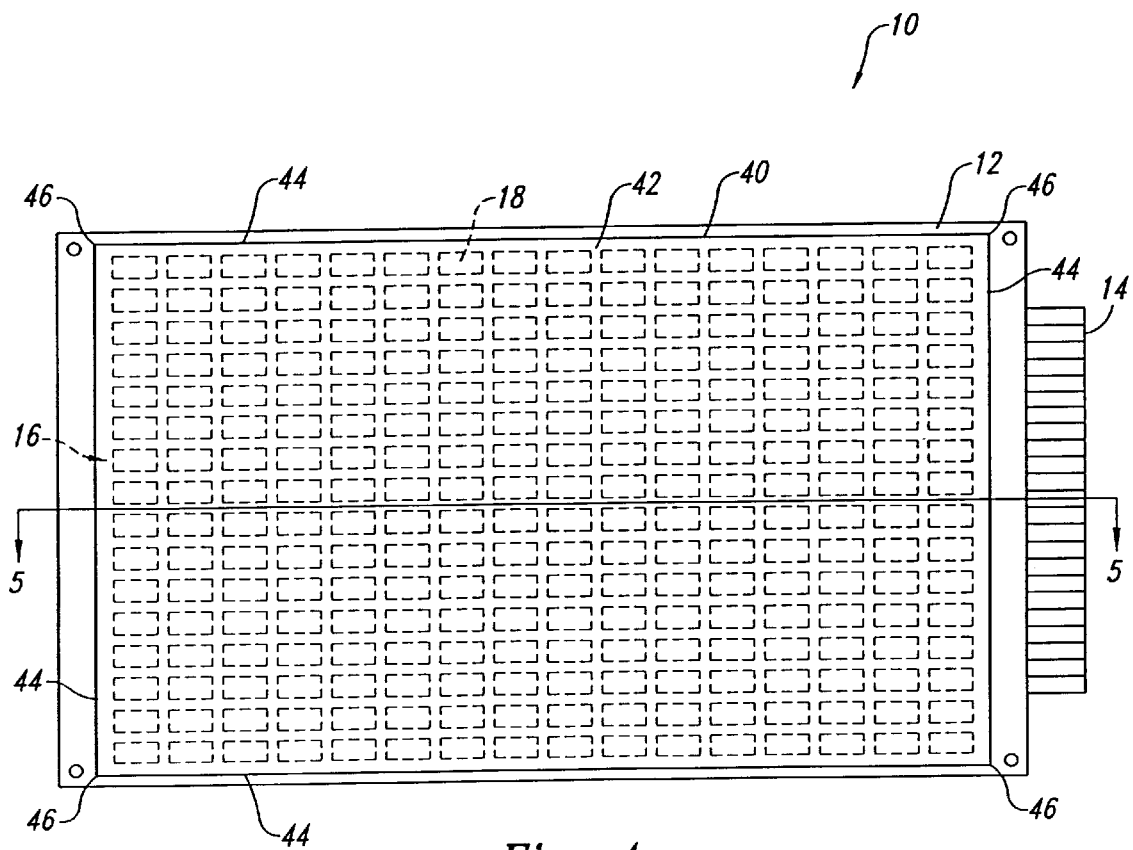
FIG. 4 is a top plan view of the burn-in board of FIGS. 1 and 2 using the inventive method and apparatus to ensure a uniform temperature of the semiconductor devices mounted on the burn-in board.
Figure 5:
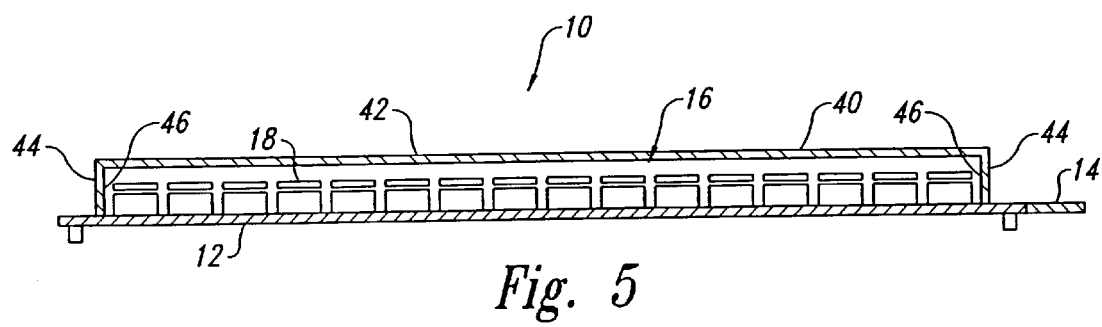
FIG. 5 is a cross-sectional view taken along the line 5—5 of FIG. 4.

A preferred embodiment of the invention is illustrated in FIGS. 4 and 5 in which the components of a burn-in board 10 have been provided with the same reference numeral as in FIGS. 1 and 2. In accordance with the invention, a cover 40 is positioned over the sockets and integrated circuits of the prior art burn-in board illustrated in FIGS. 1 and 2. Thus, as illustrated in FIGS. 4 and 5, The cover 40 includes a top panel 42 and 4 sidewalls 44 extending downwardly to the surface of the substrate 12. The sidewalls 44 have edges 46 at each end, and the adjacent edges 46 of the sidewalls 44 preferably adjoin each other so that there are no gaps in the cover 40. The lower edges of the sidewalls 44 may simply rest on the surface of the substrate 12 or they may be attached by suitable means, such as a releasable sealant. The cover 40 prevents air from flowing along the semiconductor devices 18 mounted in sockets 16 so that the temperature of the semiconductor devices 18 is entirely uniform. However, since the air continues to flow through the chamber 22 of the burn-in oven 20 from a common source, the temperature of the semiconductor devices 18 from the bottom of the chamber 22 to the top of the chamber 22 is uniform. The cover 40 thus ensures a uniformity of temperature of the semiconductor devices 18 that has not heretofore been possible following the conventional wisdom of attempting to make the airflow across the semiconductor devices 18 ever more uniform.

Although the inventive method and apparatus has been explained primarily with reference to a burn-in oven, it will be understood that it is also applicable to other types of environmental testing devices, such as cooling chambers, and that various modifications may be made without deviating from the spirit and scope of the invention. Also, although the invention has been explained primarily with respect to production testing of semiconductor devices in which the devices are temporarily mounted in sockets, it will be understood that the devices may be permanently mounted on the substrate 12. Thus, for example, the substrate 12 may be a computer motherboard that is to be environmentally tested. Accordingly, the invention is not limited except as by the appended claims.

What is claimed is:

1. A circuit board adapted for environmental testing of a plurality of semiconductor devices adapted to be mounted on said board, said circuit board comprising:

a substrate;

a plurality of semiconductor device sockets mounted on said substrate, each of said sockets being adapted to mate with a semiconductor device;

a connector on said substrate connected to said semiconductor device sockets, said connector adapted to mate with a connector in a burn-in oven to route signals to and from said semiconductor device sockets from test equipment external to said substrate; and an air impermeable cover enclosing the semiconductor device sockets on said substrate, said cover including a top panel overlying said substrate and having an inner surface facing said substrate, said cover further including a plurality of side panels extending from said top panel and terminating in respective marginal edges, the marginal edges of said side panels contacting said substrate so that said top panel and said side panels enclose said semiconductor device sockets, said side panels spacing the inner surface of said top panel from said semiconductor device sockets.

2. The apparatus of claim 1 wherein said substrate is generally rectangular, and wherein said top panel is sized and shaped to generally conform to the size and shape of said substrate, and wherein the marginal edges of said side panels are mounted on said substrate with said top panel overlying substantially all of the sockets mounted on said substrate.

3. The apparatus of claim 2 wherein each end of each of said side panels has an edge, and wherein adjacent end edges of adjacent side panels are connected to each other.

4. The apparatus of claim 1 wherein said cover comprises a cover formed with a material that is substantially impervious to the flow of air therethrough.

5. An apparatus for environmental testing of a plurality of semiconductor devices, comprising:

an enclosed environmental testing chamber having a temperature regulating device for controlling the temperature in said testing chamber, an airflow device for causing air to flow through said testing chamber, and a plurality of test connectors in said testing chamber adapted to mate with connectors of respective circuit boards;

a testing device electrically coupled to said test connectors;

a plurality of circuit boards, each of said circuit boards having a substrate, a plurality of semiconductor device sockets mounted on said substrate each of which are adapted to mate with a semiconductor device, and a board connector on said substrate connected to said semiconductor device sockets, said board connector adapted to mate with one of said test connectors; and an air impermeable cover mounted on said substrate, said cover enclosing the semiconductor device sockets on said substrate, said cover including a top panel overlying said substrate and having an inner surface facing said substrate, said cover further including a plurality of side panels extending from said top panel and terminating in respective marginal edges, the marginal edges of said side panels contacting said substrate so that said top panel and said side panels enclose said semiconductor device sockets, said side panels spacing the inner surface of said top panel from said semiconductor device sockets.

6. The apparatus of claim 5 wherein said environmental testing chamber comprises a burn-in oven, and said temperature regulating device comprises a heater.

7. The apparatus of claim 5 wherein said substrate is generally rectangular, and wherein said top panel is sized and shaped to generally conform to the size and shape of said substrate, and wherein the marginal edges of said side panels are mounted on said substrate with said top panel overlying substantially all of the sockets mounted on said substrate.

8. The apparatus of claim 7 wherein each end of each of said side panels has an edge, and wherein adjacent end edges of adjacent side panels are connected to each other.

9. The apparatus of claim 5 wherein said cover comprises a cover formed from a material that is substantially impervious to the flow of air therethrough.

10. An apparatus for testing a plurality of semiconductor devices, comprising:

an enclosed environmental testing chamber having a temperature regulating device for controlling the temperature in said testing chamber, an airflow device for causing air to flow through said testing chamber, and a plurality of test connectors in said testing chamber adapted to mate with connectors of respective circuit boards;

a testing device electrically coupled to said test connectors;

a plurality of circuit boards, each of said circuit boards having a substrate, a plurality of semiconductor devices mounted on said substrate, and a board connector on said substrate connected to said semiconductor devices, said board connector adapted to mate with one of said test connectors; and an air impermeable cover mounted on said substrate, said cover enclosing said semiconductor devices on said substrate, said cover including a top panel overlying said substrate and having an inner surface facing said substrate, said cover further including a plurality of side panels extending from said top panel and terminating in respective marginal edges, the marginal edges of said side panels contacting said substrate so that said top panel and said side panels enclose said semiconductor devices, said side panels spacing the inner surface of said top panel from said semiconductor devices.

11. The apparatus of claim 10 wherein said environmental testing chamber comprises a burn-in oven, and said temperature regulating device comprises a heater.

12. The apparatus of claim 10, further comprising a plurality of semiconductor device sockets mounted on said circuit board, each of said semiconductor device sockets receiving one of said semiconductor devices.

13. The apparatus of claim 10 wherein said substrate is generally rectangular, and wherein said top panel is sized and shaped to generally conform to the size and shape of said substrate, and wherein the marginal edges of said side panels are mounted on said substrate with said top panel overlying substantially all of the semiconductor devices mounted on said substrate.

14. The apparatus of claim 13 wherein each end of each of said side panels has an edge, and wherein adjacent end edges of adjacent side panels are connected to each other.

15. The apparatus of claim 10 wherein said cover is formed from a material that is substantially impervious to the flow of air therethrough.

* * * * *